US010155313B2

(12) United States Patent
Langford et al.

(10) Patent No.: US 10,155,313 B2
(45) Date of Patent: Dec. 18, 2018

(54) DISCRETE ASSEMBLERS UTILIZING CONVENTIONAL MOTION SYSTEMS

(71) Applicant: Massachusetts Institute of Technology, Cambridge, MA (US)

(72) Inventors: William Kai Langford, Cambridge, MA (US); Matthew Eli Carney, Brookline, MA (US); Benjamin Jenett, Cambridge, MA (US); Neil Gershenfeld, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 15 days.

(21) Appl. No.: 15/031,545

(22) PCT Filed: Apr. 22, 2016

(86) PCT No.: PCT/US2016/028806
§ 371 (c)(1),
(2) Date: Apr. 22, 2016

(87) PCT Pub. No.: WO2016/172452
PCT Pub. Date: Oct. 27, 2016

(65) Prior Publication Data
US 2018/0009110 A1  Jan. 11, 2018

Related U.S. Application Data

(60) Provisional application No. 62/151,709, filed on Apr. 23, 2015.

(51) Int. Cl.
*G05B 19/418* (2006.01)
*B25J 9/16* (2006.01)
(Continued)

(52) U.S. Cl.
CPC ............. *B25J 9/1687* (2013.01); *B23P 19/04* (2013.01); *B25J 5/02* (2013.01); *B29C 64/00* (2017.08);
(Continued)

(58) Field of Classification Search
CPC ................. B29C 64/112; B33Y 80/00; G05B 2219/49023; G05B 19/042; B25J 9/08;
(Continued)

(56) References Cited

U.S. PATENT DOCUMENTS

| 4,133,235 A | 1/1979 | Gerber | |
|---|---|---|---|
| 4,611,397 A * | 9/1986 | Janisiewicz | H05K 13/0015 29/705 |

(Continued)

OTHER PUBLICATIONS

Seitz, PCT/US99/05820.*
(Continued)

*Primary Examiner* — Darrin D Dunn
(74) *Attorney, Agent, or Firm* — Flachsbart & Greenspoon, LLC

(57) ABSTRACT

An alternative to additive manufacturing is disclosed, introducing an end-to-end workflow in which discrete building blocks are reversibly joined to produce assemblies called digital materials. Described is the design of the bulk-material building blocks and the devices that are assembled from them. Detailed is the design and implementation of an automated assembler, which takes advantage of the digital material structure to avoid positioning errors within a large tolerance. To generate assembly sequences, a novel CAD/CAM workflow is described for designing, simulating, and assembling digital materials. The structures assembled using this process have been evaluated, showing that the joints perform well under varying conditions and that the assembled structures are functionally precise.

26 Claims, 11 Drawing Sheets

(51) Int. Cl.
| | |
|---|---|
| *B33Y 10/00* | (2015.01) |
| *B33Y 30/00* | (2015.01) |
| *B29C 64/00* | (2017.01) |
| *B23P 19/04* | (2006.01) |
| *B25J 5/02* | (2006.01) |
| *G01L 5/00* | (2006.01) |
| *G05B 19/402* | (2006.01) |
| *G06F 17/50* | (2006.01) |

(52) U.S. Cl.
CPC ............... *B33Y 10/00* (2014.12); *B33Y 30/00* (2014.12); *G01L 5/0085* (2013.01); *G05B 19/402* (2013.01); *G05B 2219/45064* (2013.01); *G05B 2219/49023* (2013.01); *G06F 17/50* (2013.01); *Y10S 901/09* (2013.01)

(58) Field of Classification Search
CPC .... B25J 9/0015; B25J 13/082; B25J 15/0023; B25J 15/0061
See application file for complete search history.

(56) References Cited

U.S. PATENT DOCUMENTS

| | | | |
|---|---|---|---|
| 5,378,185 A | 1/1995 | Ban | |
| 5,650,704 A | 7/1997 | Pratt et al. | |
| 7,848,838 B2 | 12/2010 | Gershenfeld et al. | |
| 8,005,566 B2* | 8/2011 | Katoh | G05B 19/402 700/160 |
| 9,700,975 B2* | 7/2017 | Kelkar | B23Q 1/015 |
| 2003/0182014 A1* | 9/2003 | McDonnell | G05B 19/4065 700/159 |
| 2004/0020092 A1 | 2/2004 | Christensen | |
| 2005/0107000 A1* | 5/2005 | Otsuki | G05B 19/404 451/5 |
| 2006/0226802 A1 | 10/2006 | Marentette | |
| 2008/0109103 A1* | 5/2008 | Gershenfeld | B33Y 50/02 700/119 |
| 2008/0281462 A1* | 11/2008 | Suh | G05B 19/40931 700/181 |
| 2009/0276070 A1 | 11/2009 | Burkes et al. | |
| 2013/0189028 A1* | 7/2013 | Gershenfeld | F16B 3/00 403/345 |
| 2014/0007394 A1* | 1/2014 | Haas | B24B 39/006 29/90.01 |
| 2014/0300211 A1 | 10/2014 | Peek et al. | |
| 2015/0019019 A1 | 1/2015 | Veres et al. | |
| 2015/0068562 A1* | 3/2015 | Littleton | B08B 3/102 134/157 |

OTHER PUBLICATIONS

Written Opinion of the International Searching Authority, International Application No. PCT/US2016/028806, dated Aug. 25, 2016.
International Search Report, International Application No. PCT/US2016/028806, dated Aug. 25, 2016.
Search History, International Application No. PCT/US2016/028806, dated Aug. 9, 2016.
Notification of Transmittal of the International Search Report and the Written Opinion of the International Searching Authority, or the Declaration, dated Aug. 25, 2016.
Chapter II Demand Form PCT/IPEA/401, filed Feb. 7, 2017, International Application No. PCT/US2016/028806.
Letter Accompanying the Amendments Under Article 34 (Rule 66.8), filed Feb. 7, 2017, International Application No. PCT/US2016/028806.
Claims Replacement Sheet for Article 34 Amendments, filed Feb. 7, 2017, International Application No. PCT/US2016/028806.
Notification of Transmittal of International Preliminary Report on Patentability, dated Nov. 2, 2017, International Application No. PCT/US16/28806.
International Preliminary Report on Patentability, dated Nov. 2, 2017, International Application No. PCT/US16/28806.
Article 34 filing, dated Nov. 2, 2017, International Application No. PCT/US16/28806.
J. Hiller et al., "Methods of Parallel Voxel Manipulation for 3D Digital Printing," in Proceedings of the 18th solid freeform fabrication symposium., 2007, p. 12.
E. D. Kunt et al, "Miniaturized modular manipulator design for high precision assembly and manipulation tasks," 2012 12th IEEE Int. Work. Adv. Motion Control, pp. 1-6, Mar. 20.
A. Stolt et al. "Force controlled assembly of emergency stop button," 2011 IEEE Int. Conf. Robot. Autom., pp. 3751-3756, May 2011.
Luo, Xiangcheng et al., Material contacts under cyclic compression, studied in real time by electrical resistance measurement, Journal of Materials Science, 35 (2000) 4795-480.
B. G. Compton and J. A. Lewis, "3D-Printing of Lightweight Cellular Composites," Adv. Mater., p. n/a-n/a, Jun. 2014.
S. Shan et al., "Multistable Architected Materials for Trapping Elastic Strain Energy," Adv. Mater., p. n/a-n/a, Jun. 2015.
D. Raviv et al, "Active Printed Materials for Complex Self-Evolving Deformations," Sci. Rep. , vol. 4, p. 7422, 2014.
A. Russo et al., "Pen-on-Paper Flexible Electronics," Adv. Mater. , vol. 23, No. 30, pp. 3426-3430, 2011.
D. Zhao et al., "Conductivity enhancement of aerosol-jet printed electronics by using silver nanoparticles ink with carbon nanotubes," Microelectron. Eng. , vol. 96, pp. 71-75.
["Voltera." [Online]. Available: http://voltera.io/. [Accessed: Nov. 26, 2015].
"Voxel8." [Online]. Available: http://www.voxel8.co/. [Accessed: Nov. 27, 2015].
K. Sun et al., "3D printing of interdigitated Li-ion microbattery architectures," Adv. Mater. , vol. 25, No. 33, pp. 4539-4543, 2013.
E. Malone et al., "Freeform fabrication of zinc-air batteries and electromechanical assemblies," Rapid Prototyp. J. , vol. 10, No. 1, pp. 58-69, 2004.
J. J. Adams, Conformal printing of electrically small antennas on three-dimensional surfaces., Adv. Mater. , vol. 23, No. 11, pp. 1335-1340, Mar. 2011.
S.B. Fuller, "Ink-jet printed nanoparticle microelectromechanical systems," J. Microelectromechanical Syst., vol. 11, No. 1, pp. 54-60, 2002.
G. A. Popescu, "Digital materials for digital printing," NIP Digit. Fabr . . . , pp. 1-4, 2006.
R. MacCurdy, "Bitblox: Printable digital materials for electromechanical machines," Int. J. Rob. Res., Jul. 2014.
J.D. Hiller et al., "Fully Recyclable Multi-Material Printing," Solid Free. Fabr. Symp. , pp. 98-106, 2009.
K. Gilpin et al., "Robot pebbles: One centimeter modules for programmable matter through self-disassembly," 2010 IEEE Int. Conf. Robot. Autom., pp. 2485-2492, May 2010.

\* cited by examiner

DISCRETE ASSEMBLERS UTILIZING CONVENTIONAL MOTION SYSTEMS

This invention was made with Government support under Grant No. CMMI-1344222 awarded by the National Science Foundation, Grant Nos. NNX14AG47A, NNX14AM40H, and NNX14AH75A awarded by NASA, and Grant No. W911NF-14-2-0063 awarded by the Army Research Office. The Government has certain rights in the invention.

This application claims the benefit of U.S. Provisional Application No. 62/151,709, filed Apr. 23, 2015, the entire disclosure of which is herein incorporated by reference.

TECHNICAL FIELD OF THE INVENTION

The present invention relates to electronic digital materials, and more specifically to automated assembly of electronic digital materials.

BACKGROUND OF THE INVENTION

Prior work has been done in making machines that assemble structures from discrete parts. Hiller et al. showed a method of parallel part placement of voxel spheres in [J. Hiller and H. Lipson, "Methods of Parallel Voxel Manipulation for 3D Digital Printing," in Proceedings of the 18th solid freeform fabrication symposium, 2007, p. 12]. These voxels, however, do not interlock in a structural way and so a binder must be used after depositing the spheres. Assembly machines have also been created for use in assembling micro-electronics. [see E. D. Kunt, A. T. Naskali, and A. Sabanovic, "Miniaturized modular manipulator design for high precision assembly and manipulation tasks," 2012 12th IEEE Int. Work. Adv. Motion Control, pp. 1-6, March 2012]. These machines operate as pick-and-place machines, having an external magazine of parts from which parts are picked but do not physically register the toolhead to the structure or circuit board. Active research in assembling structures with robotic arms looks to incorporate force sensing to do closed loop force control rather than displacement control. [see A. Stolt, M. Linderoth, A. Robertsson, and R. Johansson, "Force controlled assembly of emergency stop button," 2011 IEEE Int. Conf. Robot. Autom., pp. 3751-3756, May 2011].

This invention describes a set of machines capable of building structures by the additive assembly of discrete parts. These digital material assemblies (described, in part, in U.S. Pat. No. 7,848,838) constrain the constituent parts to a discrete set of possible positions and orientations. In doing so, the structures exhibit many of the properties inherent in digital communication such as error correction and fault tolerance and allow the assembly of precise structures with comparatively imprecise tools. The machines responsible for assembling digital materials should leverage, to the extent possible, the interlocking and error-correction naturally present in the discrete parts.

Interest in additive manufacturing has recently been spurred by the promise of multi-material printing and the ability to embed functionality and intelligence into objects. The present invention discloses an alternative to additive manufacturing, introducing an end-to-end workflow in which discrete building blocks are reversibly joined to produce assemblies called digital materials. The present invention describes the design of the bulk-material building blocks and the devices that are assembled from them. The present invention details the design and implementation of an automated assembler, which takes advantage of the digital material structure to avoid positioning errors within a large tolerance. To generate assembly sequences, a novel CAD/CAM workflow is used for designing, simulating, and assembling digital materials. The structures assembled using this process have been evaluated, showing that the joints perform well under varying conditions and that the assembled structures are functionally precise. A very similar evaluation method applied to more standardized material samples has been described [see Luo, Xiangcheng, Chung, D. D. L., Material contacts under cyclic compression, studied in real time by electrical resistance measurement, Journal of Materials Science, 35 (2000) 4795-4801]. However, the present invention details an evaluation method for digital materials.

There has been recent interest in fabrication processes and material systems that enable functionality to be embedded within structure. Researchers in the fields of additive manufacturing and digital materials, in particular, have been exploring ways of accomplishing this.

Multi-Material Additive Manufacturing

The recent interest in additive manufacturing has, in part, been spurred by the promise that complex multi-material structures can be printed with embedded functionality. Recent work has demonstrated that 3D printing enables the fabrication of ultralight lattices [see B. G. Compton and J. a. Lewis, "3D-Printing of Lightweight Cellular Composites," Adv. Mater., p. n/a-n/a, June 2014], auxetic energy-damping structures [see S. Shan, S. H. Kang, J. R. Raney, P. Wang, L. Fang, F. Candido, J. a. Lewis, and K. Bertoldi, "Multistable Architected Materials for Trapping Elastic Strain Energy," Adv. Mater., p. n/a-n/a, June 2015], and self-folding chains [see D. Raviv, W. Zhao, C. McKnelly, A. Papadopoulou, A. Kadambi, B. Shi, S. Hirsch, D. Dikovsky, M. Zyracki, C. Olguin, R. Raskar, and S. Tibbits, "Active Printed Materials for Complex Self-Evolving Deformations," Sci. Rep., vol. 4, p. 7422, 2014]. Commercial 3D printers are able to print objects from a wide range of materials including sintered metals and nylon, UV-cured resin, and thermoplastics like ABS and PLA. However, these printers are generally restricted to printing a single material at a time and only a small number of commercially available printers are able to simultaneously print with multiple materials; those that can, are limited to printing plastics with a relatively narrow range of material properties.

None of these printers, however, have been able match the properties and variety of electronic materials needed to print a full range of electronic devices. While researchers have recently developed conductive ink formulations that enable the controlled deposition of highly-conductive traces [see A. Russo, B. Y. Ahn, J. J. Adams, E. B. Duoss, J. T. Bernhard, and J. A. Lewis, "Pen-on-Paper Flexible Electronics," Adv. Mater., vol. 23, no. 30, pp. 3426-3430, 2011; D. Zhao, T. Liu, J. G. Park, M. Zhang, J. M. Chen, and B. Wang, "Conductivity enhancement of aerosol jet printed electronics by using silver nanoparticles ink with carbon nanotubes," Microelectron. Eng., vol. 96, pp. 71-75, 2012], they have not yet been commercialized (although two are very close to market [see "Voltera." [Online]. Available: http://voltera.io/. [Accessed: 26 Nov. 2015]; "Voxel8." [Online]. Available: http://www.voxel8.co/. [Accessed: 27 Nov. 2015]]). Still, these formulations are one to two orders of magnitude less conductive than bulk metal and often require a post-bake processing step to evaporate the solvent, which limits the substrate material choice.

With these conductive inks, researchers have started to show that it is possible to print functional electronics. Using specially formulated anode and cathode inks, researchers are able to print lithium ion [see K. Sun, T. S. Wei, B. Y. Ahn, J. Y. Seo, S. J. Dillon, and J. a. Lewis, "3D printing of interdigitated Li-ion microbattery architectures," Adv. Mater., vol. 25, no. 33, pp. 4539-4543, 2013] and zinc-air [see E. Malone, K. Rasa, D. Cohen, T. Isaacson, H. Lashley, and H. Lipson, "Freeform fabrication of zinc-air batteries and electromechanical assemblies," Rapid Prototyp. J., vol. 10, no. 1, pp. 58-69, 2004] batteries. In another study, the conductive inks were conformally printed on 3D substrates to fabricate efficient antennas [see J. J. Adams, E. B. Duoss, T. F. Malkowski, M. J. Motala, B. Y. Ahn, R. G. Nuzzo, J. T. Bernhard, and J. a Lewis, "Conformal printing of electrically small antennas on three-dimensional surfaces," Adv. Mater., vol. 23, no. 11, pp. 1335-40, March 2011]. Ink-jet printing has also been used in similar ways to deposit highly conductive silver traces to create electromechanical functionalities like an electrostatic motor [see S. B. Fuller, E. J. Wilhelm, and J. M. Jacobson, "Ink-jet printed nanoparticle microelectromechanical systems," J. Microelectromechanical Syst., vol. 11, no. 1, pp. 54-60, 2002]. While 3D printers are capable of fabricating objects from a wide range of materials, they all fundamentally perform more-or-less the same task of carefully positioning a print head and depositing or fusing a precise amount of material. If the speed of the positioning is not precisely mapped to the rate of deposition or fusing of material, the fabricated object will have bumps or voids. The accuracy of the final product is therefore ultimately determined by the accuracy of the machine. A model printed on a hobbyist's home 3D printer will come out markedly different from the same model printed on a million dollar commercial 3D printer.

SUMMARY OF THE INVENTION

Digital Material Assembly

An alternative approach to multi-material additive manufacturing looks to discretize material into individual building blocks. Digital materials are assemblies of individual building blocks, each having a discrete set of possible positions and orientations [see G. A. Popescu, T. Mahale, and N. A. Gershenfeld, "Digital materials for digital printing," NIP Digit. Fabr. . . . , pp. 1-4, 2006]. The building blocks structurally interlock with neighboring ones such that they register to a lattice. This approach has many traits that make it a compelling alternative to conventional (analog) manufacturing techniques. For one, errors within a tolerance can be restored, enabling an assembler to assemble an object more accurate than itself. That is to say, two very different assemblers, if given the same building blocks, would assemble precisely the same object within the tolerance of the feature size of the building block. Secondly, since the building blocks structurally interlock, dissimilar materials are easily joined, enabling multi-material fabrication with a much broader range of materials. Finally, when the object is no longer needed, the parts can be disassembled and reused rather than thrown away.

A number of different variations of digital materials and methods of discrete assembly have been explored. MacCurdy et al., for example, assembled functional electronic circuits from individual component building blocks [see R. MacCurdy, a. McNicoll, and H. Lipson, "Bitblox: Printable digital materials for electromechanical machines," Int. J. Rob. Res., July 2014]. The building blocks themselves were made from printed circuit boards and commercially available press-fit connectors were used to join the blocks to each other. A 3D printer was modified with a part placement head in order to automate the assembly of the blocks. Automated assembly was demonstrated through the assembly of an infrared remote control composed of 17 blocks.

In another work by Hiller et al., a serial voxel assembler was demonstrated, which builds multi-material objects from discrete spherical building blocks [see J. D. Hiller and H. Lipson, "Fully Recyclable Multi-Material Printing," Solid Free. Fabr. Symp., pp. 98-106, 2009]. The assembler assembled structures from three different materials simultaneously. The voxels were bound together using a liquid adhesive binder and the researchers showed that structures could be recycled by simply dissolving the binder in water. The assembler was able to place parts at a speed of approximately 2 Hz, which was demonstrated by building a dome shape composed of approximately 400 voxels in three minutes.

The present invention introduces an end-to-end workflow for discrete assembly, enabling a new kind of electronic material system. This invention spans part design and production, digital material CAD/CAM tools, and automated assembly workflows. In comparison with existing approaches, this invention uses fundamental building blocks that structurally interlock and shows that complex electronic functionality can be built up from just two bulk material building block-types. Furthermore, the invention demonstrates how to build an automated serial assembler. The invention further demonstrates that the automated serial assembler can take advantage of the digital material properties to build objects more precise than itself.

DETAILED DESCRIPTION OF INVENTION

Figure 1:
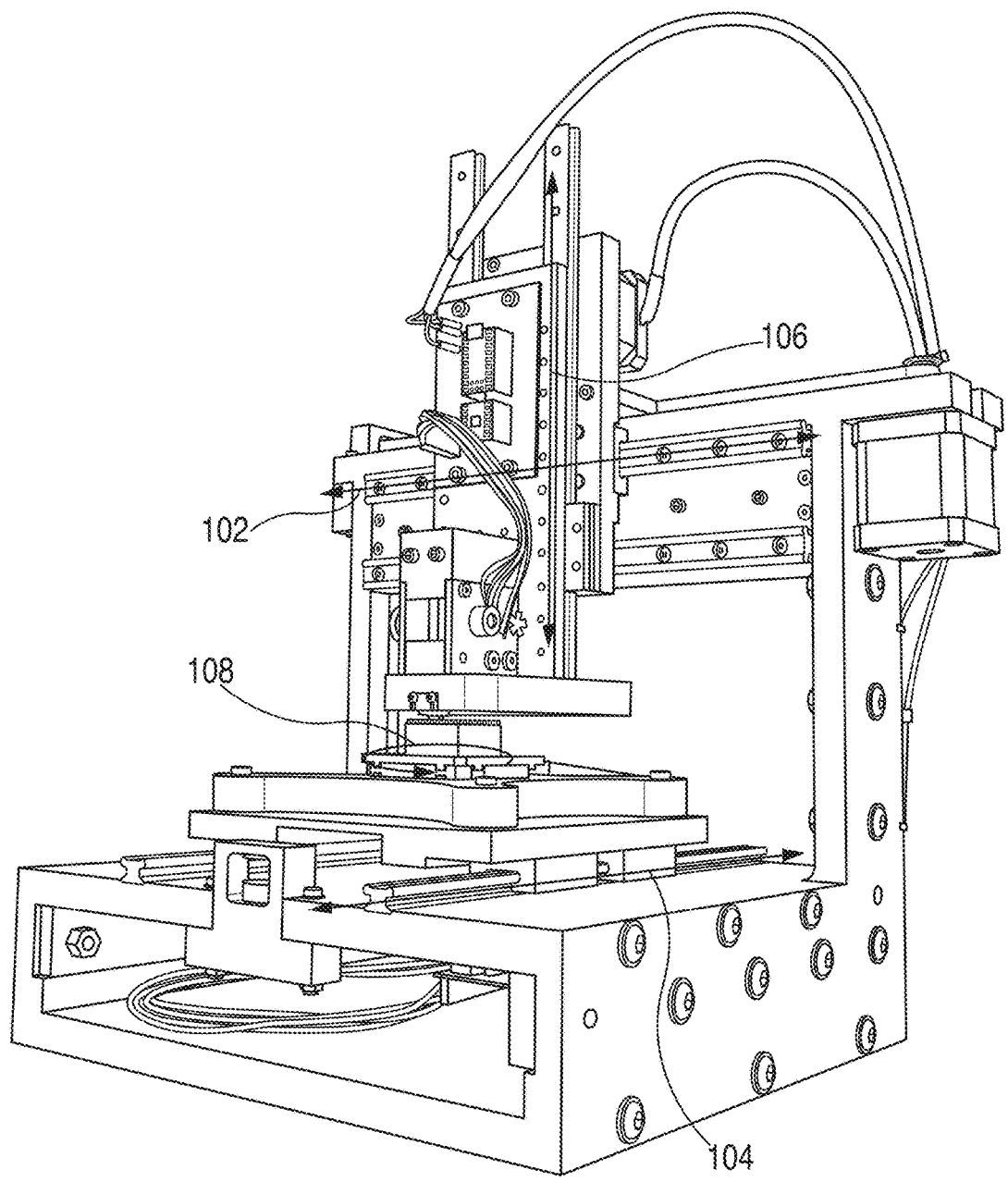
FIG. 1 is a 4-axis discrete assembler.
Figure 2:
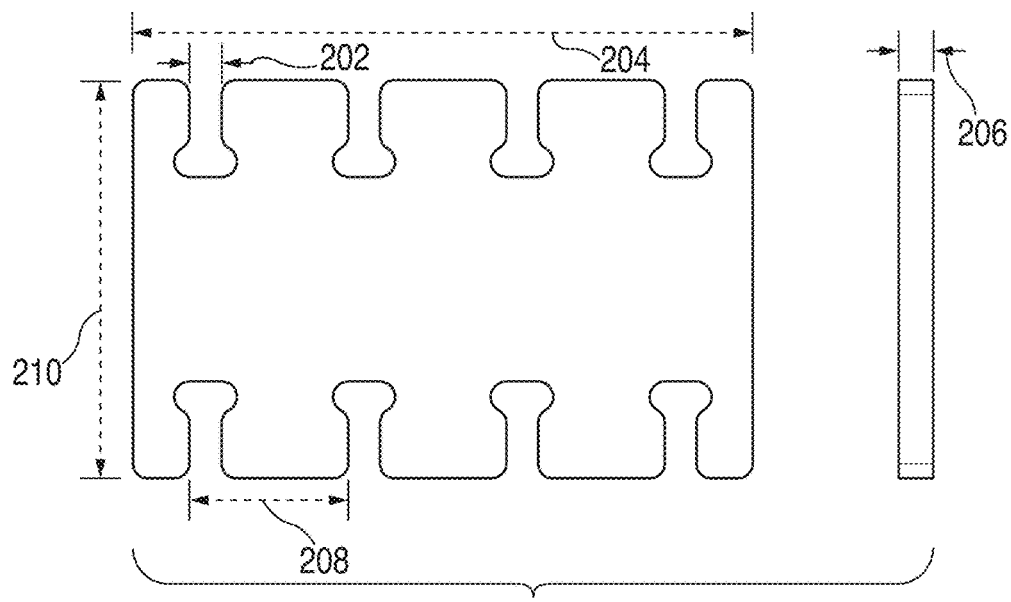
FIG. 2 is an example of a discrete GIK part with a rotational asymmetry.
Figure 3:
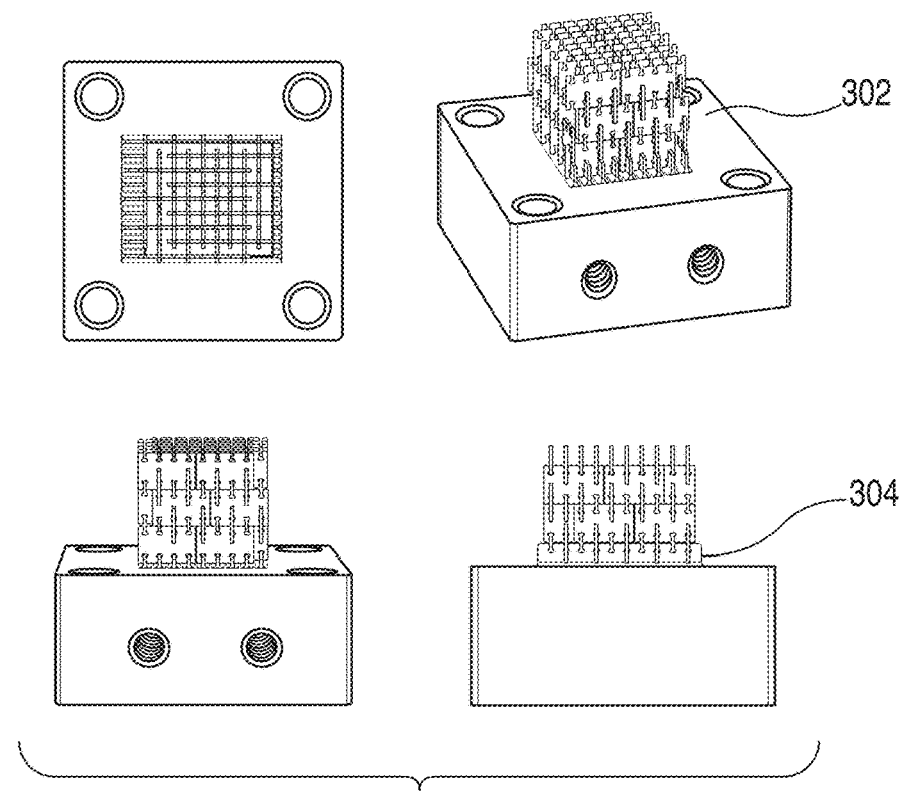
FIG. 3 is a structure built from the discrete parts of FIG. 2.

An embodiment of the present invention positions a toolhead relative to the structure being fabricated using three conventional linear axes: X 102, Y 104, and Z 106 (FIG. 1). A fourth C-axis (108) may be necessary if the part has a rotation asymmetry and requires a rotation about the Z-axis between layers (as is the case of the part pictured in FIG. 2 and structure pictured in FIG. 3). Conventional motion systems including, but not limited to, timing belts, leadscrews, and rack and pinion mechanisms may be used as power transmission between the motors and the positioning stages. The dimensions of FIG. 2 (in inches) are 0.010 202, 0.1950 204, 0.010 206, 0.05 208, and 0.1250 210. FIG. 3 shows a discretely assembled structure 302 and a substrate 304.

Figure 4:
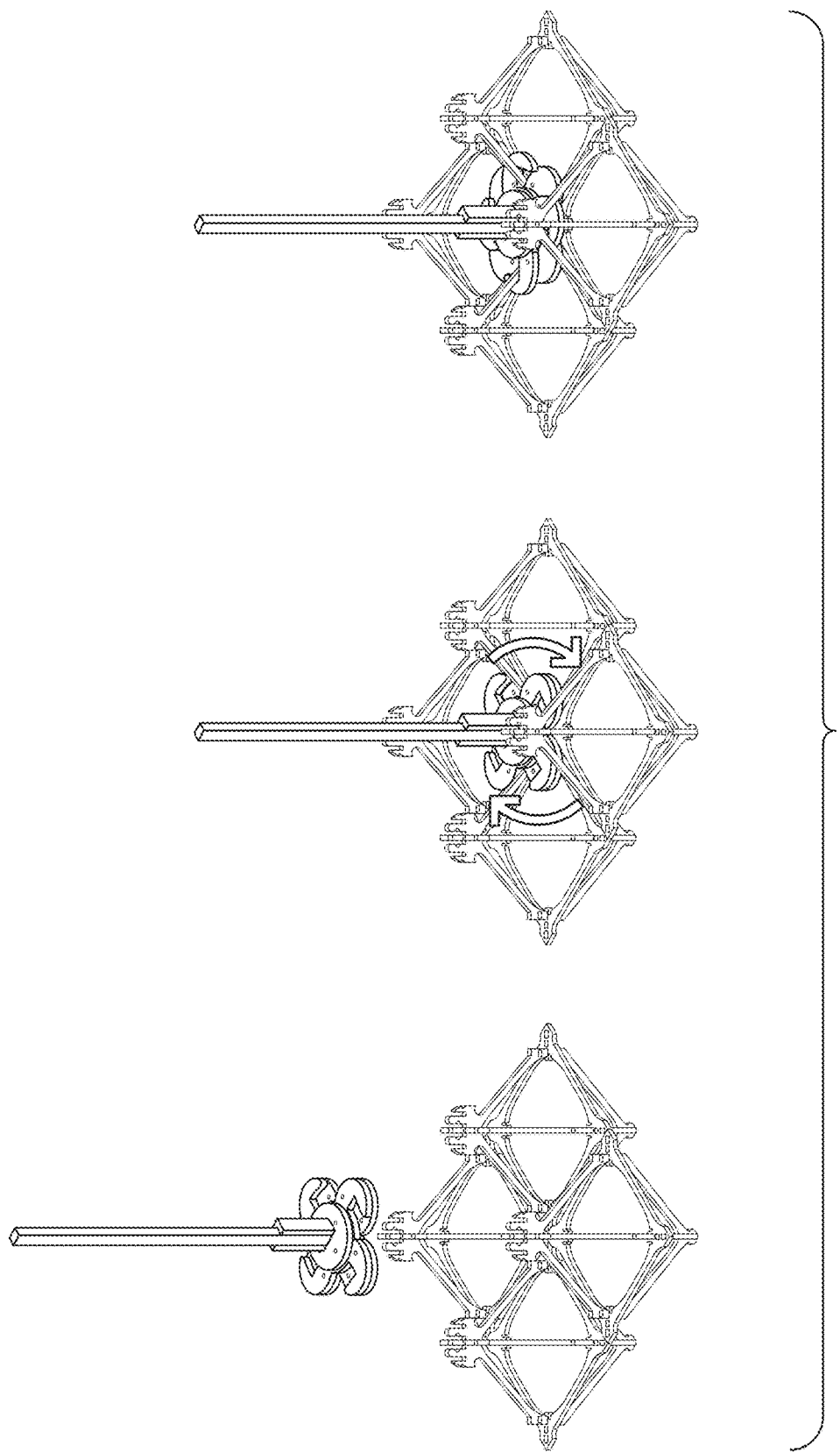
FIG. 4 is a foot used for passively aligning to the structure and temporarily locking the machine in place.

Another embodiment of the present invention positions a toolhead relative to a lattice structure along three conventional linear axes of motion (X, Y, and Z), and also includes a foot mechanisms for moving the machine relative to the lattice structure in at least one or more directions. The foot mechanism for moving the machine relative to the lattice structure may in some instances operate independently of the toolhead motion system, or in some instances, may have motions coupled to the toolhead motion system. The foot mechanism for relative motion includes an end-effector for locating and temporarily fixturing to the lattice structure. The locating end-effector includes features for passively locating to the lattice, and may also include a mechanism for locking to the lattice (FIG. 4). The ability of the assembler machine to move relative to the lattice allows the toolhead to operate on a larger volume than that defined by its primary positioning system. The motion system for the foot is composed of conventional motion mechanisms.

Figure 5:
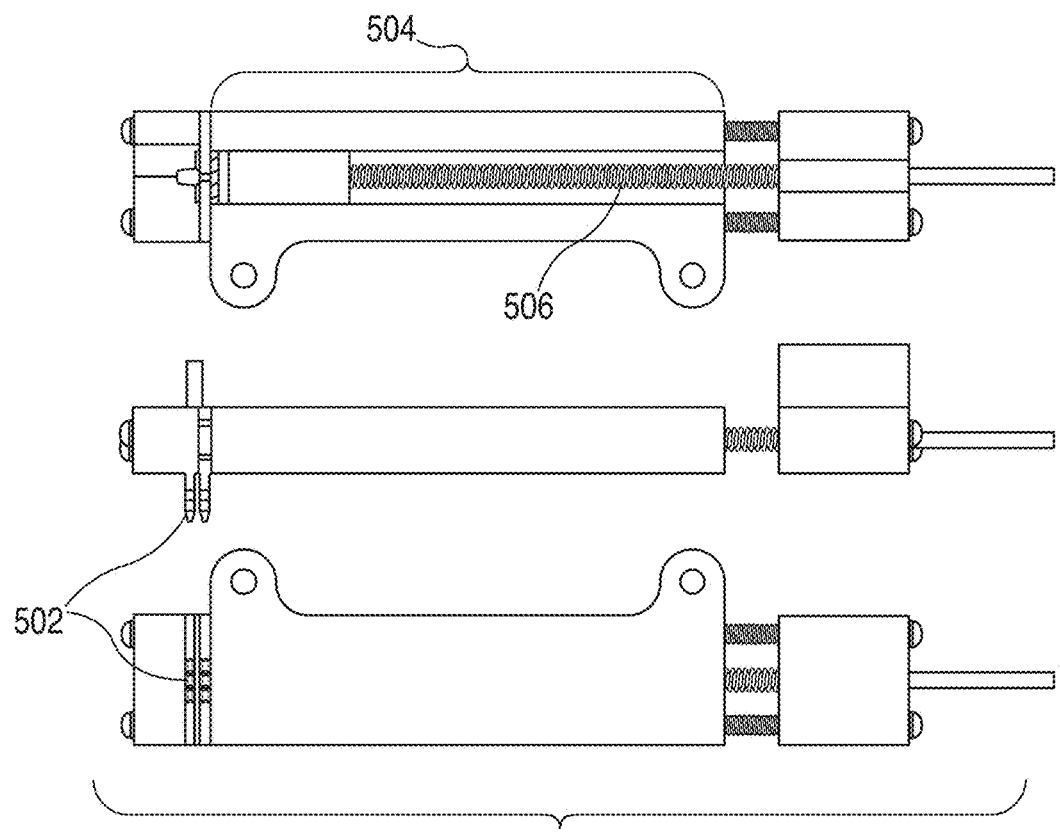
FIG. 5 shows the detail of a "stapler" (onboard part storage).

While the machine positions using conventional motion systems, the toolhead incorporates alignment features that interface with the structure being built and ensure registration between the tool and the lattice of parts. In this instantiation, the alignment features consist of chamfered or tapered alignment fingers 502 that are inserted into the negative space of the lattice (FIG. 5). FIG. 5 shows a magazine of parts 504 and a magazine spring 506. An alternative configuration is also possible in which the part being placed contains alignment features such as sufficiently large chamfers or fillets; in this configuration, alignment features on the toolhead are unnecessary.

Figure 6:
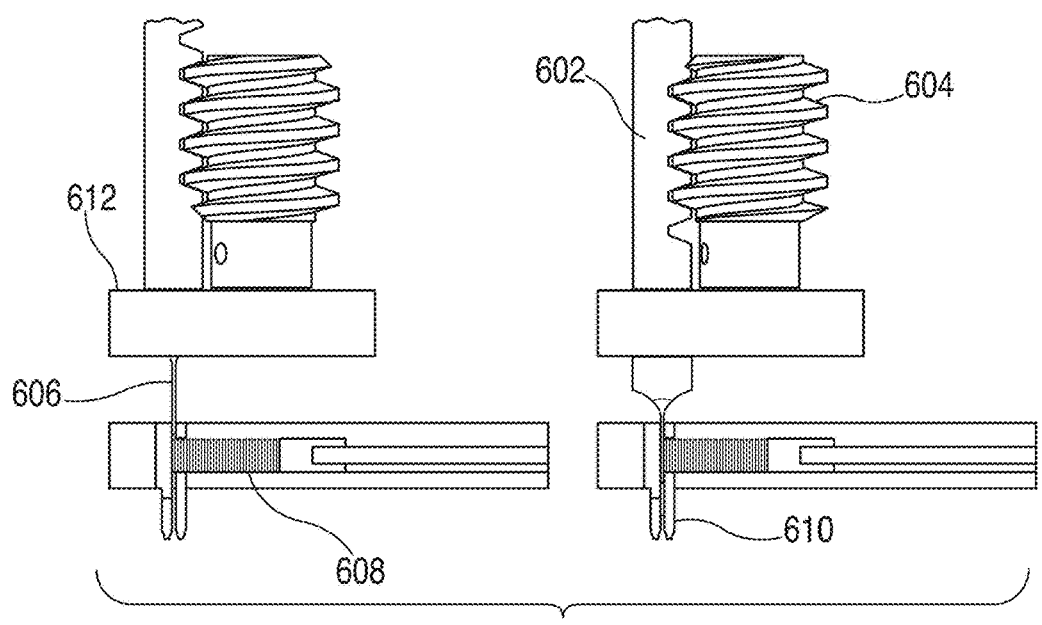
FIG. 6 is a rack and worm gear mechanism to "place" a part, with the blade in upper-most position (left), and blade in lower-most position (right).

In such a machine, parts are stored onboard the toolhead in a magazine (in a way similar to that of a conventional stapler) (item 608). A rack 602 and worm gear 604 mechanism is used to drive a blade 606 which pushes a part out of the magazine and into the structure (FIG. 6). The bearing block is item 612. The deposited part is item 610. A number of other mechanisms would be capable of serving this same purpose including, but not limited to, a linkage, a rack and pinion, and a leadscrew or ballscrew.

Figure 7:
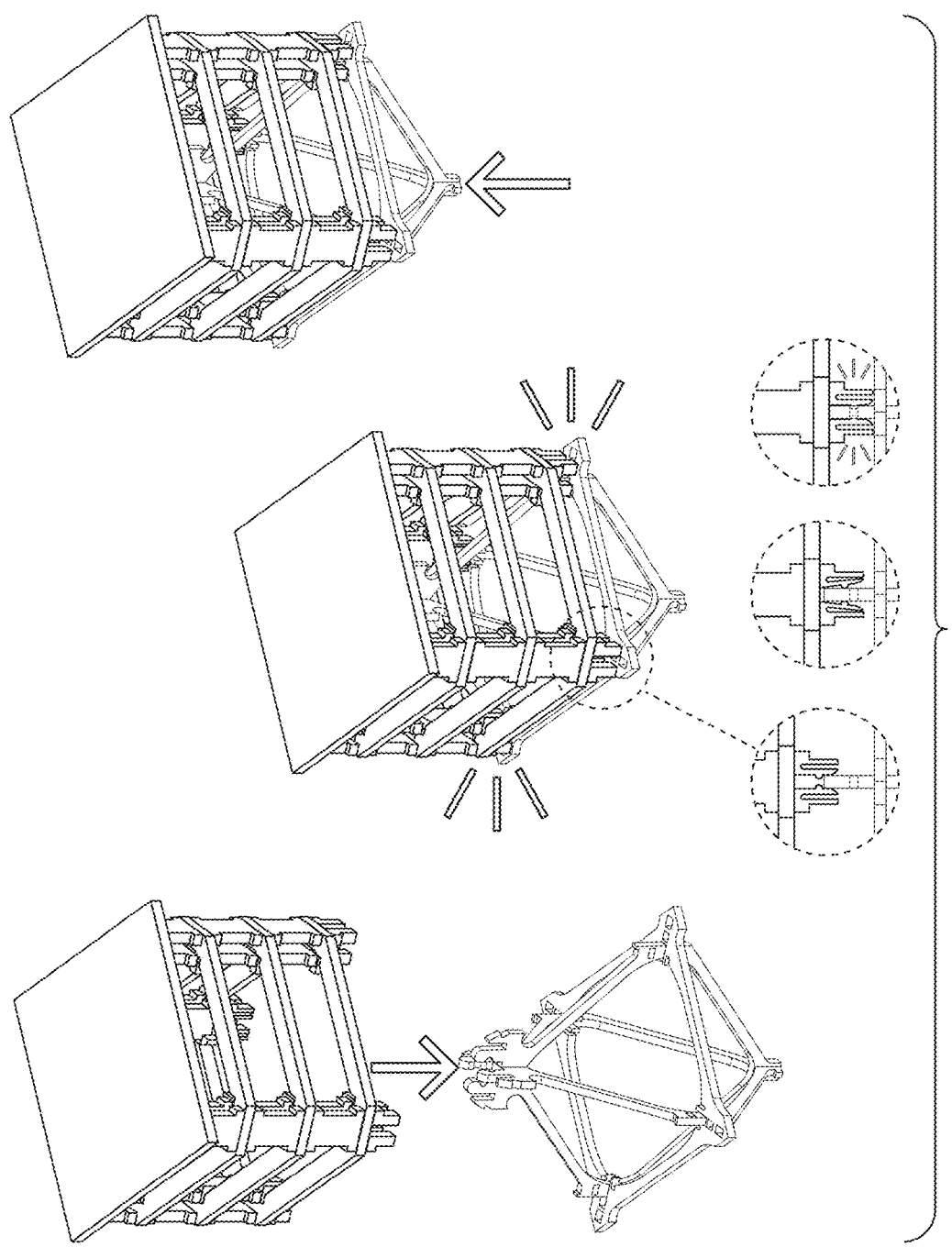
FIG. 7 is a passive toolhead with snap-fit to pick-up part.

Parts, however, may also be stored off-board the toolhead. In such a machine configuration the active (mechanism) toolhead is replaced with a passive snap-fit or flexural clamp (FIG. 7). Parts are stored in a magazine within reach of the passive toolhead such that the machine can pick up a part from the magazine and place a part in the lattice. The strength of the bond between the passive toolhead and the part must be tuned such that it is stronger than the bond between the magazine and part but weaker than the bond between the part and the structure.

Figure 8:
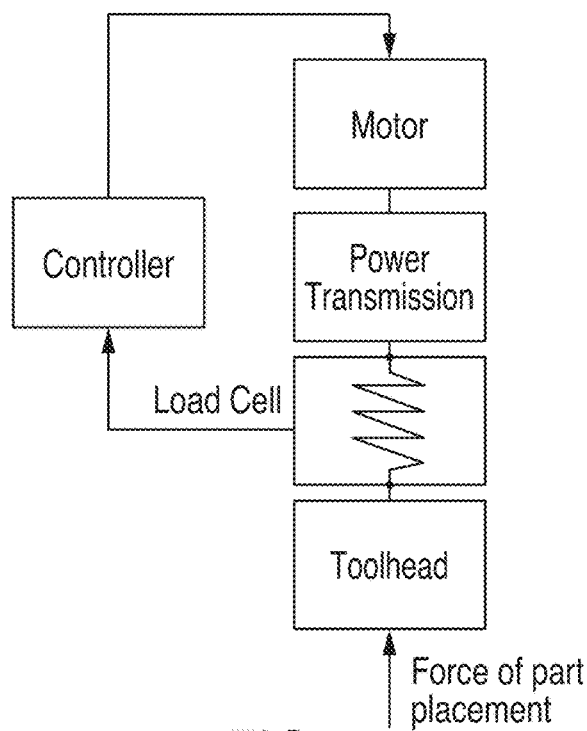
FIG. 8 is a series elastic actuator configuration used for force controlled part placement.

Control can be accomplished simply using industry-standard G-code. This entails using the machine in a position-controlled mode since the drive motors are simply told how far to move during each step of the process. A more advanced configuration might include the use of force sensors to allow a more repeatable localization relative to the lattice. This is particularly useful in the Z-axis of this machine configuration and is accomplished by adding a load cell in series between the toolhead and the drive motor. Instead of driving the toolhead to a known position, the Z-axis would drive the toolhead with a desired downward force (FIG. 8). On-board sensing of the forces required to register the toolhead to the lattice, not only allows lower off-axis forces during assembly, but also enables the assembly of much larger structures. The error accumulation in the lattice can be mapped and accounted for in real-time, giving the assembler an unbounded assembly envelope. Without this, the assembly envelope is limited based on error accumulation within the lattice.

Compliance may also be added along and in rotation about the other axes (X,Y, and A-A axis is shown in FIG. 4 of U.S. Provisional Application No. 62/151,709) in order to aid in the registration of the toolhead with the structure. With added compliance in these axes, the required positional accuracy of the machine is significantly reduced and local registration can be performed passively by the alignment features on the toolhead itself.

Design

Part Design

In designing the parts of a digital material system, a number of considerations need to be taken into account, including the level of complexity of the building block. Digital material parts can range in complexity from simple single-material spheres [see Hiller and H. Lipson, "Methods of Parallel Voxel Manipulation for 3D Digital Printing," in Proceedings of the 18th solid freeform fabrication symposium, 2007, p. 12] to elaborate pre-fabricated modules [see K. Gilpin, A. Knaian, and D. Rus, "Robot pebbles: One centimeter modules for programmable matter through self-disassembly," 2010 IEEE Int. Conf. Robot. Autom., pp. 2485-2492, May 2010]. The present embodiment focuses on the low-complexity end of this spectrum, fabricating the building blocks from a single material in a one-step fabrication process.

Figure 9:
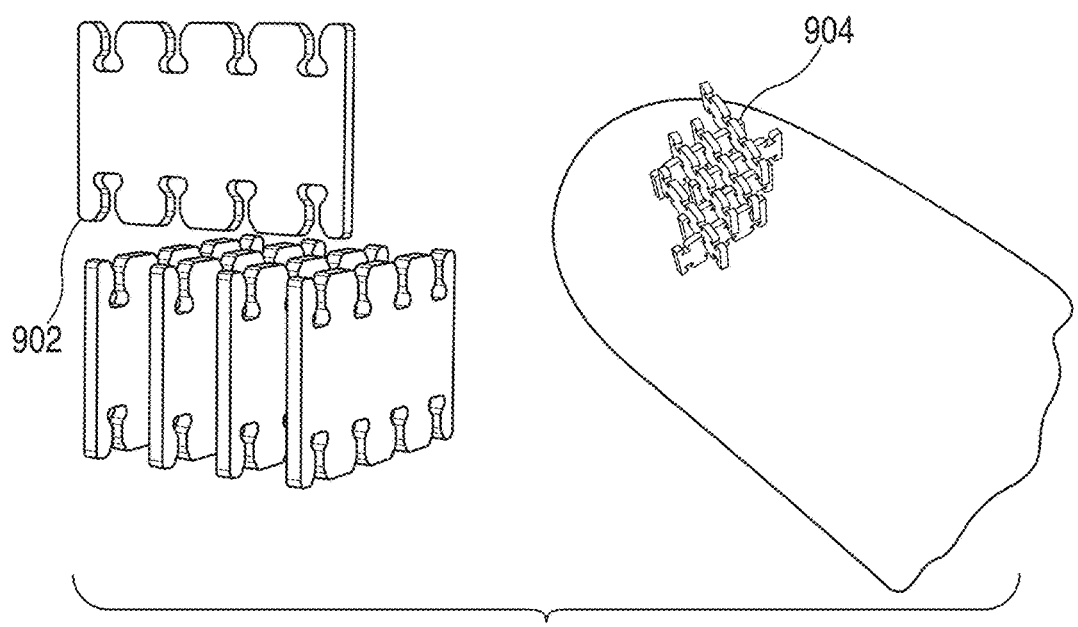
FIG. 9 is a part geometry and assembly illustration showing how parts are joined, and an assembly of GIK parts on a finger for scale.

This design choice impacts many other aspects of the part design. Since the building blocks are made from a single material, they should also preferably be two-dimensional and have a simple geometric shape such that they can be easily fabricated from many different materials at many different length-scales. In this case, a meso-scale block size, pictured in FIG. 9, was chosen to balance the difficulty of manipulation and assembly with functional density. FIG. 9 is an illustration showing how parts are joined (902), and an assembly of GIK parts on a finger for scale (904).

To automate the assembly of the parts, it is desirable to have a build-front, or a single direction from which the parts are inserted. For this reason, the parts have slots on the top and bottom to enable this kind of top-down vertical assembly. This enables parts to connect with neighbors on adjacent layers but not within the same layer. The number of slots (four on each side) is the minimum required to tile the parts orthogonally and maintain the structural integrity of the overall structure. While parts with fewer slots (and connections between layers) are certainly possible, their assemblies require increased design constraints in order to maintain structural integrity. These building blocks have been described in previous work and are referred to as GIK (Great Invention Kit) parts [see G. A. Popescu, T. Mahale, and N. A. Gershenfeld, "Digital materials for digital printing," NIP Digit. Fabr. . . . , pp. 1-4, 2006].

A critical aspect is ensuring a good connection between the individual building blocks. In this case, that means both that the parts structurally interlock, self-aligning with neighboring parts, and that, for electronic assemblies, the conductive parts are joined with little contact resistance. The slots are sized such that the insertion of one slot into another creates a press-fit joint. The insertion force required for this press-fit is tuned to balance the difficulty of insertion with the strength and reliability of the joint. Experimental evaluation and validation of these joint properties can be done.

Parts are fabricated from two different materials: one insulating and one conductive. For the insulating part-type, a garolite fiber-epoxy composite is used, which is used for its electrical resistance, its structural stiffness and strength, as well as its thermal stability. Also, because it is widely used as a substrate for conventional circuit boards, its dielectric properties are well understood. These parts are produced using a custom-built automated desktop punch-press. In order to produce the insulating parts in mass, an automated desktop punchpress is developed. The machine takes in a strip of the fiber-epoxy composite and stamps out individual parts, advancing the strip between each stamp. The machine is controlled through a javascript interface, enabling online verification of strip-advancement and measurement of tool and die wear. Using this simple machine, raw materials are able to be processed into digital material feedstock for a stapler assembler.

For the conducting part-type, brass is preferred for its stiffness, hardness, and machinability. Aluminum and copper parts are more ductile, deforming rather than creating a strong press-fit joint. While brass is good for prototyping, tin-plated phosphor-bronze alloy may be the ideal material choice for its soft-plating but high strength and stiffness. The conductive parts are produced using a Wire-EDM; a stack of shim stock is sandwiched between two plates and cut such that 20 parts are made at once.

Device Design

Using building blocks of this type, it is possible to assemble a number of different functional electronic devices. With just two block-types (conducting and insulating), electronic interconnect can be assembled. With the addition of a third resistive block, it is possible to assemble any passive electronic component. Finally, with the addition of blocks with embedded active electronic functionality (such as diodes and transistors) an entire integrated circuit may be assembled.

By strategically placing conductive building blocks within a structure, arbitrary electrical traces can be routed, connecting electrical components placed on the surface of the structure. In this case, the pitch of the digital material lattice is conveniently chosen to match the pitch of small outline integrated circuit (SOIC) surface mount components (1.27 mm). An example of this kind of assembly is one in which conductive and insulating parts are used to replace the conventional traces, pads, vias, and layers of a circuit board with a volume of electronic materials to blink an LED using an ATtiny microcontroller. With the exception of 5V power, which was provided externally by the red and black wires, everything required to blink the LED is onboard.

Going beyond circuit boards, by carefully arranging the placement of the conductive blocks in the structure, passive components themselves may be assembled. For example, by placing the conductive blocks in an interdigitated finger arrangement, a capacitor can be assembled. Similarly, by placing the conductive blocks in a spiral or helix an inductor can be assembled.

Assembler Design

Without the present invention, assemblies of hundreds of components may take many hours to assemble using tweezers. One of the primary aims of this invention is to detail the design and implementation of an automated means of assembly to increase assembly throughput and allow for greater design complexity.

The design of the assembler described in this invention resembles that of conventional fabrication machines in many ways. A 4-axis motion gantry is used to position two toolheads spatially with respect to the structure being built. However, the assembler differs from other fabrication tools in that it takes advantage of the inherent qualities of digital material structures. Unlike conventional machine tools, the assembler can correct positioning errors within a tolerance by registering with the digital material lattice, enabling the assembly of structures more accurate than the assembler itself. Similarly, unlike conventional machine tools, an assembler either places a part successfully or it does not. This kind of error is much easier to detect and correct than, for example, depositing thermoplastic slightly too quickly, as might be the case with a fused deposition modeling (FDM) 3D printer.

The assembler presented in this embodiment differs from existing automated assembly machines in a few ways. Unlike the BitBlox assembler [see R. MacCurdy, a. McNicoll, and H. Lipson, "Bitblox: Printable digital materials for electromechanical machines," Int. J. Rob. Res., July 2014], which must pick up and place a part, the assembler described in this invention stores the parts onboard in a magazine, potentially doubling the speed of assembly by eliminating traversals to the part supply area between part placements. This assembler also explicitly takes advantage of the error correction capabilities of the digital materials by adding intentional compliance between the toolhead and the structure to allow the toolhead to register to the digital material lattice. In theory, an assembler may be designed to accept a positioning error up to half of the lattice pitch of the digital material assembly. In this case that would be a positioning error of 0.635 mm.

Implementation

This assembler can be broken down into three primary subsystems: the motion gantry, the part placement or stapler mechanism, and the part storage or magazine. This section will detail their implementation.

Motion Gantry

A 4-axis motion gantry is used to position the two toolheads in X, Y, Z and C (rotation about Z) spatial coordinates. The motion gantry is constructed from a steel reinforced HDPE frame. The frame was CNC milled to precisely position all holes and pockets. Precision ground steel was then bolted to the frame pieces to add rigidity and mass. The axes use polymer linear guideways for a low friction motion in each axis. The axes are powered by high-torque NEMA-17 stepper motors and driven with GT2 timing belts. The motor and power transmission elements were specified to nominally provide a 1/16th microstep resolution of 5 μm and a maximum operating speed of 50 mm/s with a potential linear force delivery of 70N in each axis.

Some amount of backlash in timing belt transmissions is always present, and needs to be accounted for in order to position precisely. In this case the backlash in the timing belt transmission is measured to be between 125 μm and 250 μm in the X- and Y-axes. Fortunately, for this invention, it is trivial to compensate for this error by driving the axes so that they always approach a part-placement location from the same direction, effectively nulling the backlash and enabling a positioning repeatability better than 25 μm in X- and Y-axes.

To enable the toolhead of the machine to self-align with the digital material structure, intentional compliance is added between the build platform and the toolhead through the use of an XY-flexure mechanism located on the Y-axis.

The flexural mechanism, which was fabricated by CNC milling, allows deflections of 0.5 mm to occur with approximately 2 N of lateral force.

Stapler Mechanism

Figure 10:
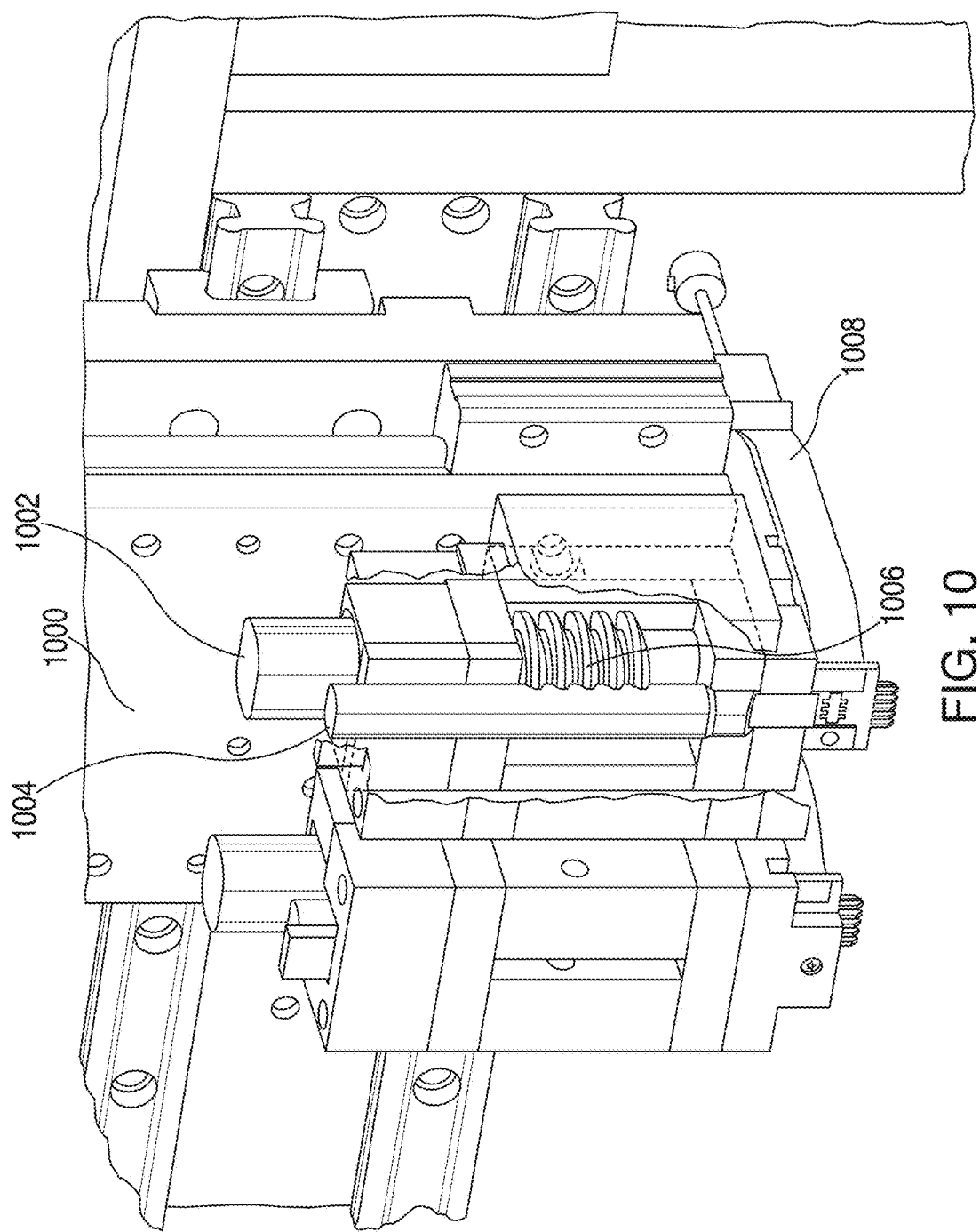
FIG. 10 shows a stapler mechanism section view.

The part placement mechanism must be fast, robust, and reliable. A number of potential mechanisms were considered and a worm-driven rack was ultimately selected for its compactness, small number of parts, and high gear ratio. This mechanism is pictured in FIG. 10.

In the mechanism 1000, a worm 1006 is driven by a DC gearmotor 1002 with a 100:1 gear reduction (from Pololu). The worm 1006, in turn, drives a piston with an integrated rack (item 1004). The piston 1004 tapers down to a blade which is just 0.25 mm thick (the thickness of a single building block). As the motor 1002 is driven, the piston 1004 is forced down, pushing out the next part 1010 in the magazine 1008. Based on the torque of the DC gearmotor 1002 and the efficiency of the rackworm interface (~50%) the piston 1004 is expected to produce roughly 32N of downward force for part-insertion, which is roughly double the expected 12N of force needed to insert a part 1010.

The motor 1002 is run with closed-loop feedback from a magnetic encoder attached to the pre-geared DC motor shaft and is current-limited to 0.5 A in software to ensure it does not overheat if stalled. The control algorithm is a basic PID controller, which drives the piston with a trapezoidal velocity profile between the two desired positions (up and down).

Using this mechanism and controller, the maximum part deposition rate was measured at 0.72 Hz. With additional tuning and component refinement this could be tuned to reach 1 Hz.

Stapler Magazine

In order to enable parts to be refilled mid-build, the stapler magazine 1100 is decoupled from the stapler mechanism, allowing the magazine to be removed and reloaded easily. In the prototype, the magazine can hold up to 100 parts. A spring is used to preload the stack of parts against the front of the magazine with a pusher 1106.

The most critical feature of this subsystem is the alignment mechanism to register the toolhead with the lattice. Alignment fingers 1104 on the front of the toolhead are used to correct for positioning errors prior to depositing a part. The pointed fingers reach into the negative space of the lattice to constrain the position in both X- and Y-axes. The toolhead is made using a variety of fabrication processes including wire-EDM and manual machining.

Figure 11:
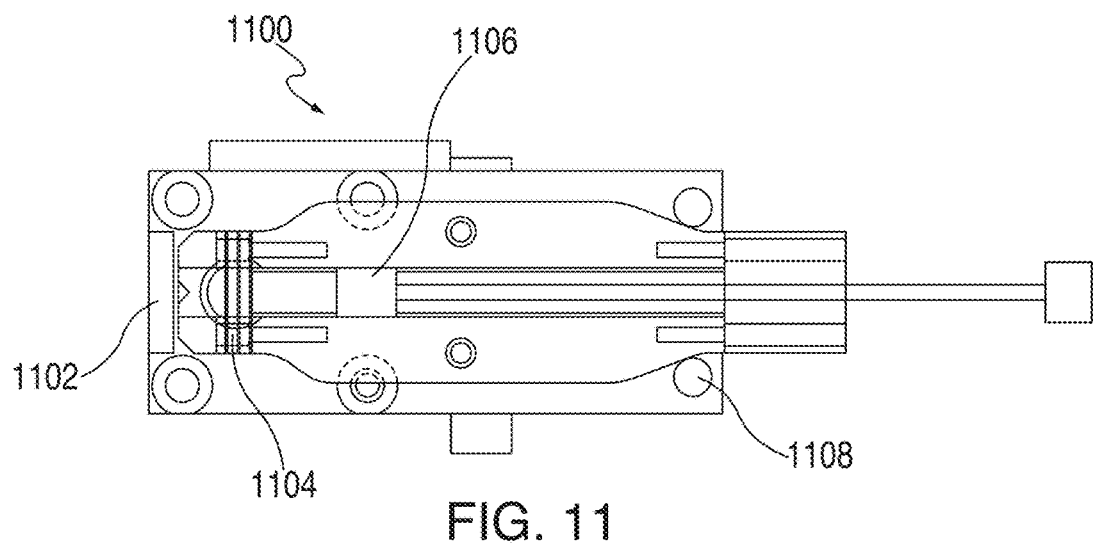
FIG. 11 shows a stapler magazine from below.

The magazine 1100 is made to be easily removable from the rest of the toolhead. This is achieved through the use of a repeatable coupling mechanism. The tapered magazine is forced up against two dowel pins 1108 by a conical point setscrew 1102, which interfaces with a conical hole on the front of the stapler magazine 1100. This constrains all 6-degrees of freedom of the stapler magazine 1100 in such a way that it can be removed and reinserted midway through a build without any loss of precision. This mechanism is pictured in FIG. 11.

CAD/CAM Workflow

Figure 12:
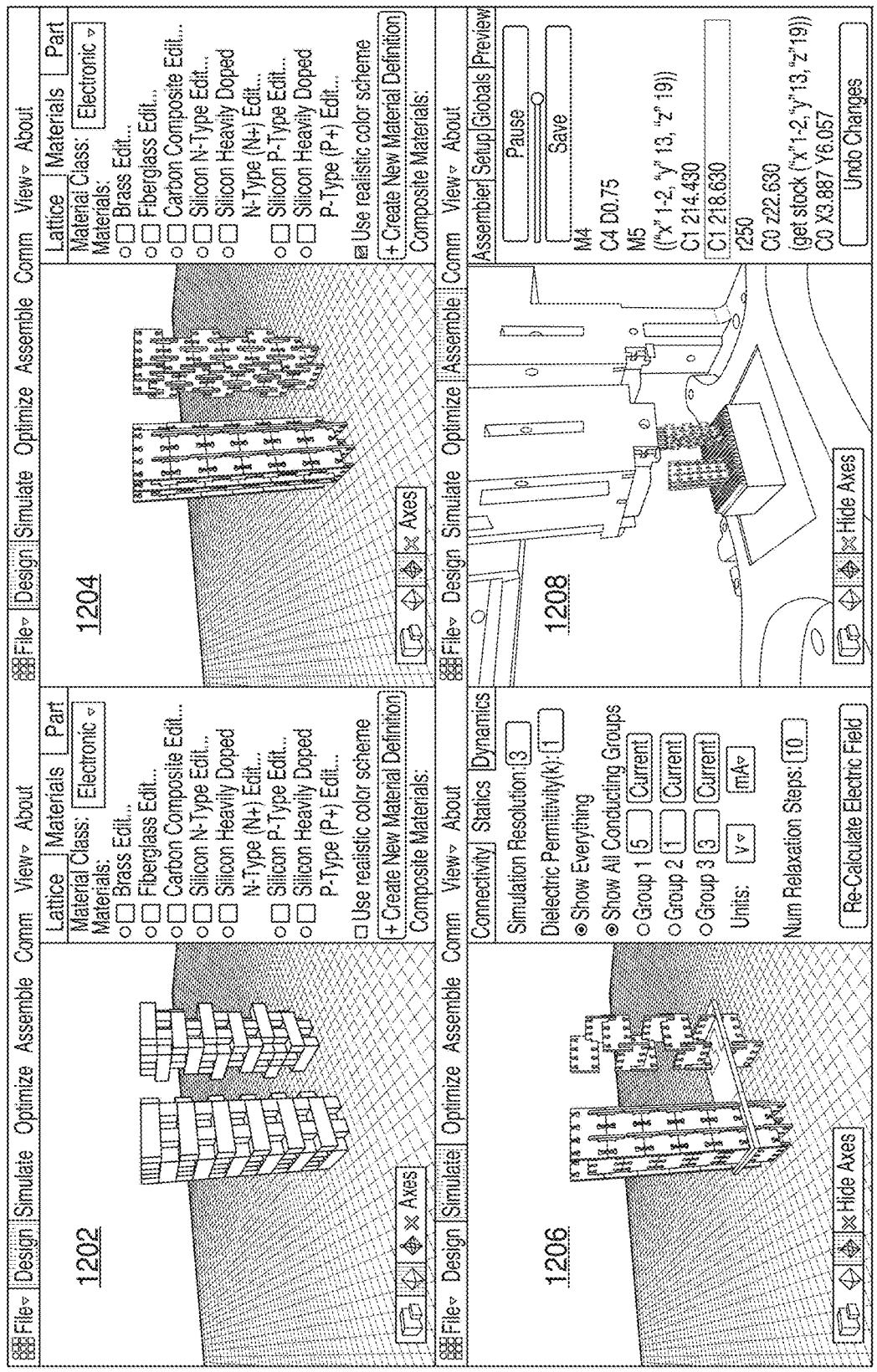
FIG. 12 are DMDesign screenshots showing design, simulation, and assembly processes.

As the size and complexity of discretely assembled structures increases, new software tools for Computer-aided Design (CAD) and Computer-aided Manufacturing (CAM) are helpful. An embodiment of this invention includes the development DMDesign, an end-to-end software workflow for the design, simulation, and toolpathing of discretely assembly of electronic structures. FIG. 12 shows four screenshots of an LC structure designed from conductive and insulating parts in several stages of the DMDesign workflow.

Structures are designed from multiple materials in a hierarchical, 3D CAD interface. Within this interface, a user can toggle between an abstract, geometric representation (1202, top left of FIG. 12) and a realistic representation (1204, top right of FIG. 12) of the parts. Once a structure has been designed, DMDesign allows a user to assess the electronic and structural interconnectivity of the assembly, as well as simulate static, 3D potential fields in and around the assembly (1206, bottom left FIG. 12). Additionally, a user may export 3D meshes from their design to evaluate in other simulation packages.

Assembly designs are brought into the CAM workflow to plan and generate toolpathing and communicate in real time with the assembler. DMDesign communicates with the assembler through a CAM protocol called G-Code. The GCode needed to assemble a given design is generated automatically by DMDesign, though users can gain low level control over the G-Code generation process via a scripting interface. Once generated, the G-Code may be simulated virtually to verify that the desired output is achieved (1208, bottom right of FIG. 12). Once verified, the G-Code is streamed to the assembler in real-time, and an open communication terminal allows users to take control of the process at any moment.

During the assembly process, the movements and state of the assembler are mirrored by a virtual assembler within DMDesign. This platform was designed with the intention of eventually supporting more back and forth interaction between DMDesign, the assembler, and the partially-assembled structure; applications include real-time sensing for increased part placement accuracy, intermediate calibration routines, and error detection and automatic correction.

Evaluation

Joint Properties

Study was made of the interface between parts in order to ensure that they produce reliable and repeatable electrical contacts. The quality of the electrical contacts is crucial not only for reliable circuitry, but also for reducing parasitics and improving the quality of the assembled components. Here, detailed is the measurement and evaluation of the electrical interfaces between parts.

Figure 13:
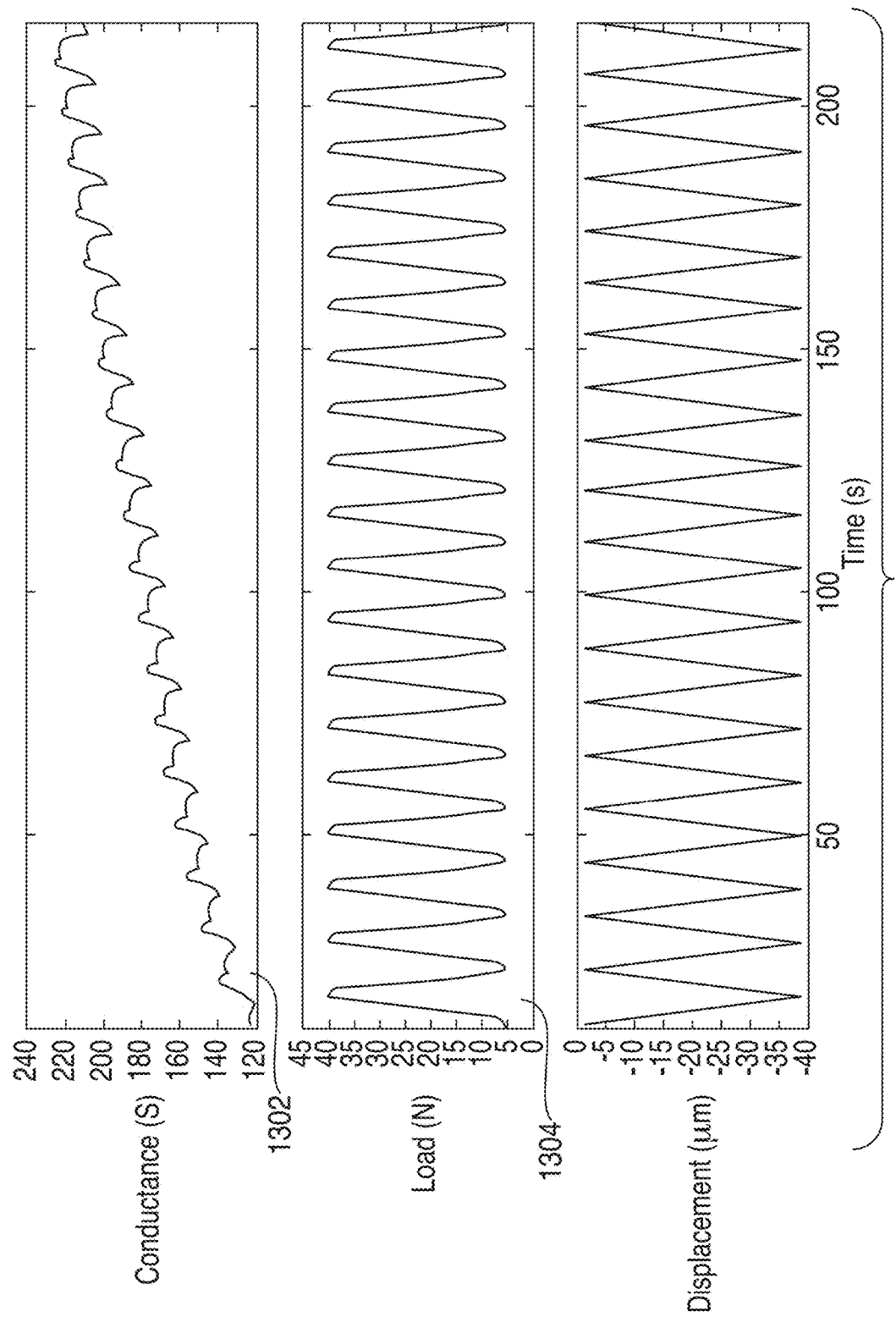
FIG. 13 shows the effect of load cycling on joint conductance.

To examine the performance of the joints within a three-dimensional structure, a test specimen is built from purely conductive parts. The structure contains a total of 100 parts with five layers, each containing two rows of ten parts. Using an Instron material testing machine, the sample is loaded in compression and the load varied between 5N and 40N (item 1304), while measuring the conductance across the sample using a four-wire resistive measurement. Over 20 load cycles there is a ratcheting increase in the conductance of the sample from 120 Siemens to almost 220 Siemens, which can be seen in FIG. 13, item 1302. As the load is cycled, the conductance measured across the structure increases from 120 Siemens to 220 Siemens (item 1302). This increase in conductance indicates that the surface is being worn, flattening surface micropeaks, and increasing the effective contact area at the joint interfaces.

Figure 14:
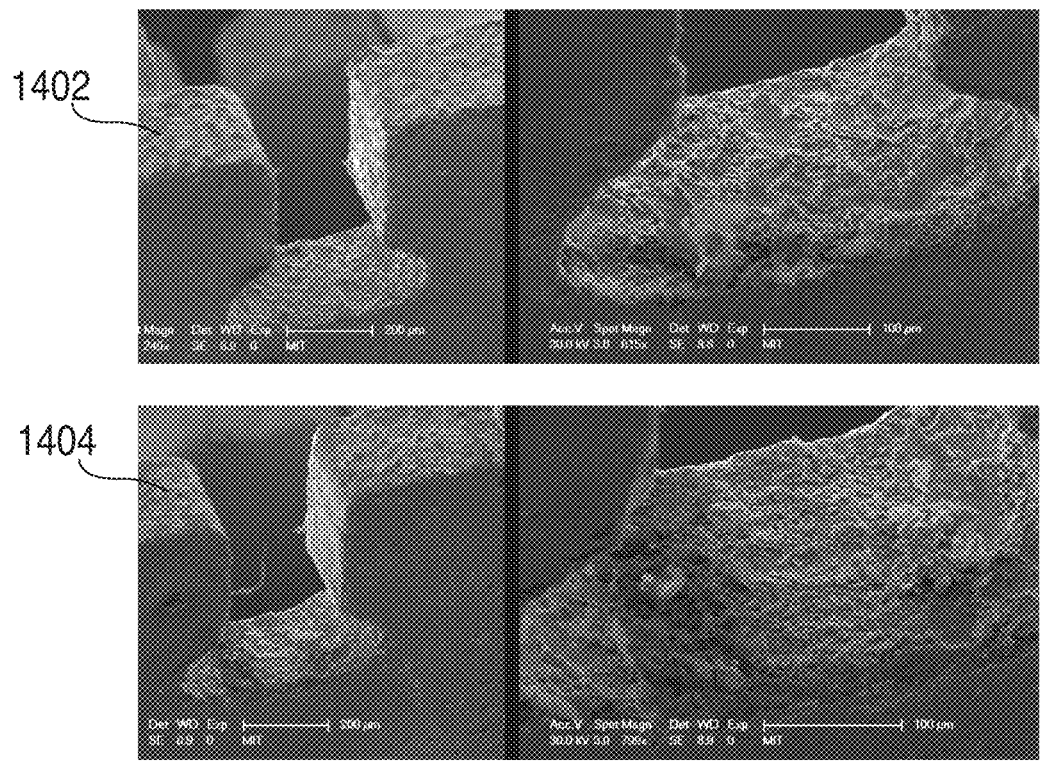
FIG. 14 is scanning electron micrograph showing joint wear.

This flattening of surface micropeaks can be seen in comparing images taken with a scanning electron microscope of a joint before and after use. The before image (pictured on top in FIG. 14, item 1402) has much more surface roughness, especially on the joint side-wall, than the after image (pictured on the bottom of FIG. 14, item 1404). The unused slot (1402) appears rougher and with more surface asperities than does the worn slot (1404).

This testing indicates that in order to reduce the effect of load cycles on the conductivity of the joints, it is desirable to preload the assembled components in compression. By preloading, the microscopic sliding of the joint faces on each other is reduced and the conductance of the structure changes less with applied load.

Machine Design

The assembler of the preferred embodiment is designed to exploit the digital material structure to correct positioning errors within a large margin. By using the alignment fingers at the bottom of the toolhead to register to the lattice for final positioning, the assembler should be able to correct for errors up to a theoretical maximum of 0.635 mm off in the X- or Y-axes.

Figure 15:
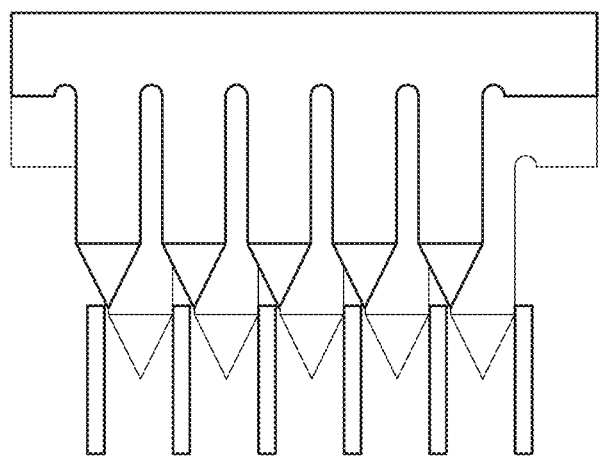
FIG. 15 is an illustration showing the positioning error tolerance region.

To test this, the machine was zeroed such that the fingers were perfectly centered in the negative space of the lattice. The machine was then commanded to move to deviations from this position and then lowered into the structure. The machine was able to accommodate deviations of up to 0.5 mm in the X- and Y-axis. When the toolhead is 0.5 mm off of center, the tips of the alignment fingers sit just inside the negative space. More than 0.5 mm off of center, and the alignment fingers crash on the top flat surface of the top layer of parts in the structure. The maximum tolerable alignment error is illustrated in FIG. 15. The alignment fingers are shown at the leftmost-end of their positioning tolerance region with respect to the lattice.

The assembler should not only be error tolerant, but it should also be relatively fast at depositing parts and building volumes.

With default settings, a typical part placement speed for the assembler is approximately 0.2 Hz (or 1 part every 5 seconds). Given this, and the geometry of the parts and the lattice, a volumetric build rate of 80 mm$^3$/min can be calculated. This is on par with the build speed of commercial 3D printers, which take a few hours to build a one cubic inch structure.

Of course, with further tuning and testing, the same hardware could be used to assemble objects much faster, potentially up to 1 Hz, at which point the stapler mechanism becomes the rate limiter. Even then, further speed improvements should be possible.

The embodiments discussed above demonstrate an end-to-end workflow for the discrete assembly of electronic digital materials, or non-electronic ones. By using parts that structurally interlock with one another, multi-material structures are able to be assembled with highly conductive electrical pathways, enabling the fabrication functional electronic devices without the need for a binder or thermal annealing. An automated assembler can programmatically assemble arbitrary structures from conductive and insulating block-types. Furthermore, by exploiting the structure of the digital materials, the assembler can be made to be extremely error tolerant.

While the above specification and examples provide a description of the invention, many embodiments of the invention can be made without departing from the spirit and scope of the invention. It is to be understood that the foregoing embodiments are provided as illustrative only, and does not limit or define the scope of the invention. Various other embodiments are also within the scope of the claims.

What is claimed is:

1. An apparatus for automated assembly of structures made up of individual building blocks, each building block having a discrete set of possible positions and orientations that structurally interlock with neighboring building blocks using press-fit joints that register the building blocks to one-another and to a lattice, the apparatus comprising:

a multi-axis motion gantry constructed to position a toolhead spatially with respect to a structure being built and to add compliance between the toolhead and the structure being built; and, a placement mechanism that drives a blade constructed to push blocks out of a magazine containing a storage of blocks and onto the lattice, the part placement mechanism having an alignment mechanism adapted to register the toolhead with the lattice;

wherein, the toolhead continuously and sequentially registers and interlocks blocks supplied by the placement mechanism to produce the structure being built;

an interface configured to control the apparatus to produce said structures, perform online verification of block placement and measurement of toolhead wear; and, a foot mechanism for moving the apparatus relative to the lattice.

2. The apparatus of claim 1, wherein the axes of the multi-axis motion gantry use polymer linear guideways and a flexural mechanism to add compliance between the structure being built and the toolhead along, and in rotation about the axes, to allow the toolhead to register to the lattice.

3. The apparatus of claim 1, wherein the multi-axis motion gantry uses three conventional linear axes (X, Y and Z), and uses a fourth C-axis for rotation about the Z-axis for placing parts with a rotational asymmetry.

4. The apparatus of claim 1, wherein the multi-axis motion gantry has a power transmission between at least one motor and at least one positioning stage, the power transmission chosen from the group consisting of timing belts, leadscrews, ballscrews, and rack and pinion mechanisms.

5. The apparatus of claim 1, wherein the multi-axis motion gantry is constructed from a steel reinforced HDPE frame, the frame being CNC milled to position holes and pockets.

6. The apparatus of claim 1, wherein the a placement mechanism has a rackworm interface, comprising:
a DC gearmotor with a shaft operated with closed-loop feedback from a magnetic encoder attached to the shaft;
a worm gear driven by the DC gearmotor;
a piston with an integrated rack driven by the worm gear, the piston operated according to a velocity control algorithm with a trapezoidal velocity profile between desired positions;
wherein, as the motor is driven, the piston is forced downward, pushing out a next part from the magazine.

7. The apparatus of claim 1, wherein the placement mechanism includes a series elastic actuator used for force controlled part placement comprising:
a controller controlling a motor;
a power transmission coupling power from the motor to the toolhead,
a load cell adapted to measure force between the motor and the toolhead.

8. The apparatus of claim 1, wherein the placement mechanism is chosen from the group consisting of: a rack and worm gear mechanism, a linkage, a rack and pinion, a leadscrew, and a ballscrew.

9. The apparatus of claim 1, wherein the magazine has a front and back and further comprises:
a spring constructed to preload the stack of blocks against the front of the magazine with a pusher;
a coupling mechanism having at least one dowel pin and a conical point setscrew which interfaces with a conical hole on the front of the magazine.

10. The apparatus of claim 1, wherein the magazine can be repeatably decoupled from the placement mechanism via a coupling mechanism that constrains 6 degrees of freedom of the magazine to enable parts to be refilled mid-build, and allowing the magazine to be removed and reloaded without loss of precision.

11. The apparatus of claim 1, wherein the toolhead has a front and back, and the alignment mechanism includes alignment fingers on the front of the toolhead used to correct for positioning errors prior to depositing a block, the fingers reaching into a negative space of the lattice to constrain the position of the toolhead in both X- and Y-axes.

12. The apparatus of claim 1, wherein the foot mechanism operates independently of the toolhead.

13. The apparatus of claim 12, wherein the foot mechanism includes an end-effector for locating and temporarily fixturing to the lattice, and includes a mechanism for locking to the lattice.

14. The apparatus of claim 1, wherein the assembler has a placement accuracy in placing blocks on the lattice, and because block positioning errors made by the assembler are corrected by registering the blocks on the lattice, registration accuracy of the blocks is greater than the placement accuracy of the assembler.

15. The apparatus of claim 1, wherein at least some of the building blocks are fabricated from an insulating material.

16. The apparatus of claim 1, wherein at least some of the building blocks are fabricated from a conductive material.

17. The apparatus of claim 1, wherein the building blocks have top and bottom slots that enable top-down vertical assembly, and wherein, the slots are sized such that the insertion of one slot into another creates a press-fit joint.

18. The apparatus of claim 1, wherein the building blocks connect with neighbor building blocks on adjacent vertical layers but not within the same layer.

19. The apparatus of claim 1, wherein the strength bonding force between the toolhead and a block is tuned so that it is greater than bonding force between the magazine and the block but less than bonding force between the block and the structure being built.

20. The apparatus of claim 1, further including at least one force sensor coupled to the blade producing a force sensor output, the at least one force sensor being implemented in a Z-axis of the multi-axis motion gantry by adding a load cell in series between the toolhead and a drive motor.

21. The apparatus of claim 20, wherein the apparatus uses the force sensor output in a closed loop control system.

22. The apparatus of claim 21, wherein the closed loop control system limits compressive force applied by the blade during assembly.

23. The apparatus of claim 21, wherein the closed loop control system logs accumulated error from placement of individual blocks in real-time.

24. The apparatus of claim 23, wherein the apparatus alters spatial or force parameters for placement of a next block based on the accumulated error.

25. The apparatus of claim 1, wherein the interface is implemented using industry-standard G-code.

26. The apparatus of claim 1, wherein the compliance is implemented using flexural mechanisms or springs.

* * * * *